(12) United States Patent
Rimbert-Riviere et al.

(10) Patent No.: US 12,431,395 B2
(45) Date of Patent: Sep. 30, 2025

(54) SEMICONDUCTOR POWER MODULE WITH CRACK SENSING

(71) Applicant: Infineon Technologies AG, Neubiberg (DE)

(72) Inventors: Charles Rimbert-Riviere, Soest (DE); Arne Eilers, Soest (DE)

(73) Assignee: Infineon Technologies AG, Neubiberg (DE)

( * ) Notice: Subject to any disclaimer, the term of this patent is extended or adjusted under 35 U.S.C. 154(b) by 519 days.

(21) Appl. No.: 17/990,960

(22) Filed: Nov. 21, 2022

(65) Prior Publication Data

US 2024/0170347 A1    May 23, 2024

(51) Int. Cl.
| | |
|---|---|
| *H01L 21/66* | (2006.01) |
| *H01L 21/48* | (2006.01) |
| *H01L 23/24* | (2006.01) |
| *H01L 23/498* | (2006.01) |
| *H01L 23/00* | (2006.01) |
| *H01L 23/373* | (2006.01) |

(52) U.S. Cl.
CPC .......... *H01L 22/20* (2013.01); *H01L 21/4846* (2013.01); *H01L 22/12* (2013.01); *H01L 22/32* (2013.01); *H01L 23/24* (2013.01); *H01L 23/3735* (2013.01); *H01L 23/49811* (2013.01); *H01L 24/48* (2013.01); *H01L 2224/48225* (2013.01); *H01L 2924/153* (2013.01)

(58) Field of Classification Search
CPC .......... H01L 22/20; H01L 22/12; H01L 22/32; H01L 21/4846; H01L 24/48; H01L 2224/48225; H01L 2924/153; H01L 23/3735; H01L 23/49811; H01L 23/24; G01D 21/02

See application file for complete search history.

(56) References Cited

U.S. PATENT DOCUMENTS

| | | | |
|---|---|---|---|
| 7,973,547 B2* | 7/2011 | Nitsch | H01L 22/12 324/754.25 |
| 9,255,894 B2* | 2/2016 | VanHoomissen | G01N 21/9505 |
| 2008/0203577 A1* | 8/2008 | Fukamizu | H01L 24/06 257/E21.507 |
| 2010/0039128 A1 | 2/2010 | Nitsch et al. | |

(Continued)

*Primary Examiner* — Michael M Trinh
(74) *Attorney, Agent, or Firm* — Murphy, Bilak & Homiller, PLLC (57) ABSTRACT

A method of producing a power semiconductor module includes providing a power electronics carrier that includes a structured metallization layer disposed on an electrically insulating substrate layer, performing a production step of the power semiconductor module using the power electronics carrier, using a sensor to obtain crack information during the production step, the crack information comprising information about whether one or more cracks occurred in the electrically insulating substrate layer during the production step, analyzing the crack information, and performing one or more of the following after analyzing the crack information: performing a subsequent production step of the power semiconductor module dependent upon the analyzed crack information, cataloging the analyzed crack information, and performing a further investigative step to inspect the electrically insulating substrate layer using the analyzed crack information.

20 Claims, 5 Drawing Sheets

(56) References Cited

U.S. PATENT DOCUMENTS

| | | | |
|---|---|---|---|
| 2010/0123134 A1* | 5/2010 | Nagata | H10D 86/60 |
| | | | 257/E23.179 |
| 2010/0127371 A1* | 5/2010 | Tschirbs | H05K 1/142 |
| | | | 257/E23.083 |
| 2016/0195581 A1* | 7/2016 | Dennison | H01L 22/34 |
| | | | 324/762.02 |
| 2016/0343642 A1* | 11/2016 | Komatsu | H01L 24/83 |
| 2019/0371685 A1* | 12/2019 | Zhang | H01L 22/12 |
| 2021/0082775 A1 | 3/2021 | Nordhoff | |
| 2022/0291277 A1* | 9/2022 | Peralta | H01L 22/20 |

* cited by examiner

SEMICONDUCTOR POWER MODULE WITH CRACK SENSING

BACKGROUND

Many different applications such as automotive and industrial applications utilize power modules. Power modules may include multiple power devices in a single packaged device. The power devices may be arranged as a power conversion circuit such as a single and multi-phase half-wave rectifier, single and multi-phase full-wave rectifier, voltage regulator, inverter, etc. Power modules may also include other elements such as driver chips and passive components. Modern power modules are designed for highly efficient operation and can improve the electric power dissipation of an electrical system. Power modules include elements that generate a substantial amount of heat during operation. For claim, power semiconductor transistor dies may operate at temperatures of at least 100° C., 150° C., 200° C. or more. Other components of power modules such as passive elements may operate at these high temperatures as well. This high temperature operation creates thermomechanical stress, e.g., due to differences in the CTE (coefficient of thermal expansion) of the materials. This thermomechanical stress can lead to failure of the components that manifests itself during assembly or later during operation.

SUMMARY

A method of producing a power semiconductor module is disclosed. According to an embodiment, the method comprises providing a power electronics carrier that comprises a structured metallization layer disposed on an electrically insulating substrate layer; performing a production step of the power semiconductor module using the power electronics carrier; using a sensor to obtain crack information during the production step, the crack information comprising information about whether one or more cracks occurred in the electrically insulating substrate layer during the production step; analyzing the crack information; and performing one or more of the following after analyzing the crack information: performing a subsequent production step of the power semiconductor module dependent upon the analyzed crack information; cataloging the analyzed crack information; and performing a further investigative step to inspect the electrically insulating substrate layer using the analyzed crack information.

A method of testing a power semiconductor module is disclosed. According to an embodiment, the method comprises providing a power semiconductor module that comprises a power electronics carrier that comprises a structured metallization layer disposed on an electrically insulating substrate layer, a power semiconductor die mounted on the structured metallization layer, a housing that encloses the power semiconductor device within an interior volume; providing a sensor; performing a testing step that uses the sensor to obtain crack information, the crack information comprising information about whether one or more cracks occurred in the electrically insulating substrate layer during the testing step; analyzing the crack information; and performing one or more of the following after analyzing the crack information: cataloging the analyzed crack information; and performing a further investigative step to inspect the electrically insulating substrate layer using the analyzed crack information.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Methods of producing a power semiconductor module and methods of testing a power semiconductor module are disclosed herein. The power semiconductor module includes a power electronics carrier that comprises a structured metallization layer disposed on an electrically insulating substrate. According to the methods, a sensor is used to obtain crack information about the electrically insulating substrate. The crack information includes information about whether one or more cracks have occurred and, if so, information about the nature of the cracks, e.g., size, location, number, etc. The crack information obtained by the sensor is analyzed and a further action is taken that is dependent upon the analyzed crack information and/or uses the analyzed crack information. In the case of a method of producing the power semiconductor module, the further action can include discarding the power electronics carrier in the case of severe cracking, cataloging the crack information for future reference, or performing further investigation steps to inspect the power electronics carrier. In the case of a method of testing the power semiconductor module, the further action can include steps such as, cataloging the crack information for future reference, or performing further investigation steps to inspect the power electronics carrier. The method of testing the power semiconductor module may assign a status to the power semiconductor module, which can be used to determine whether replacement or repairs of the power semiconductor module are necessary at a later time. The methods advantageously provide the crack sensor or sensors in situ, meaning that the sensor or sensors are directly placed at a location wherein crack detection is possible and sensing of cracks is performed as the crack arises. This allows for real time detection of cracks as they occur and corrective or mitigating action based on the crack information.

Figure 1:
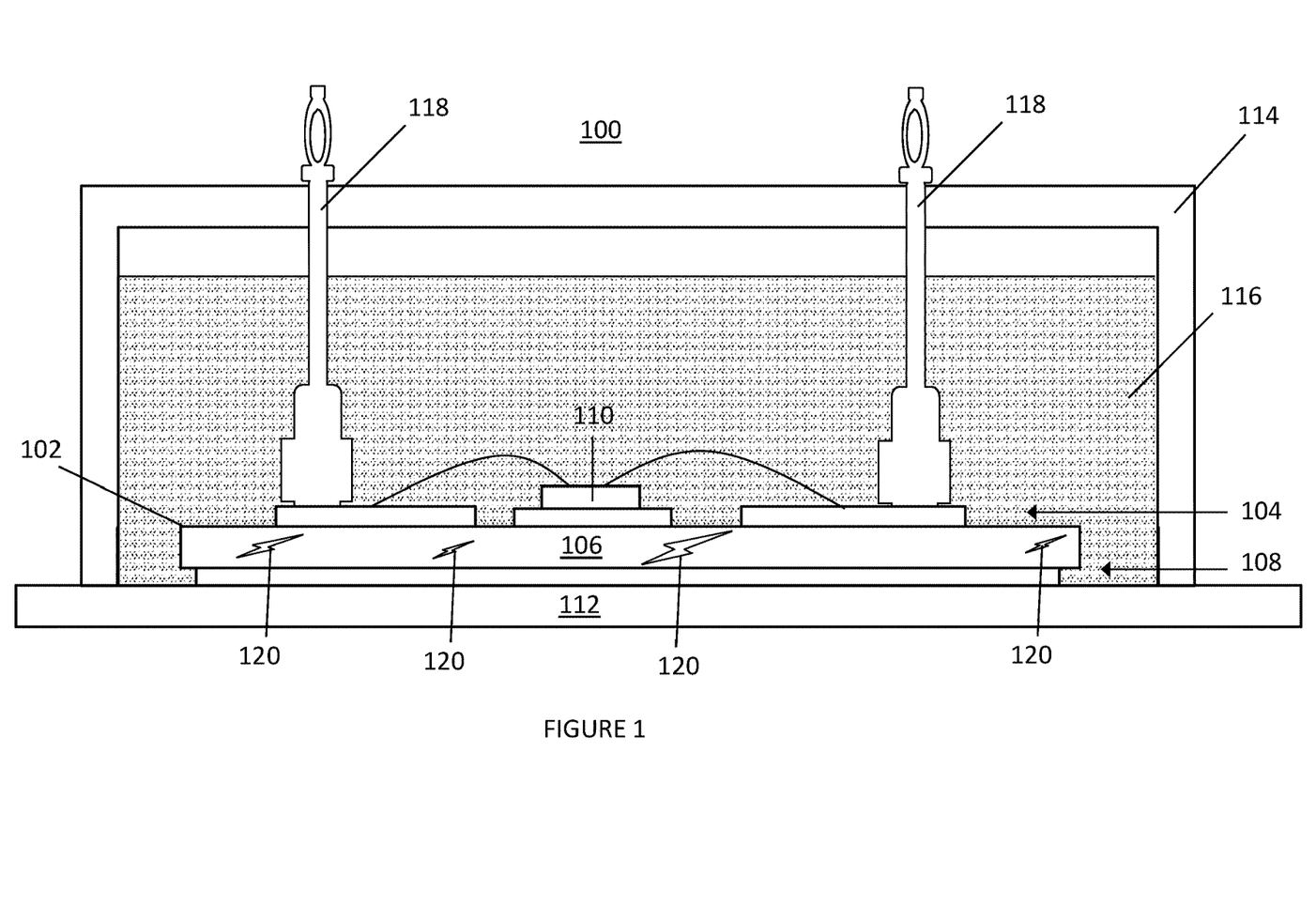
FIG. 1 illustrates a power semiconductor module, according to an embodiment.

Referring to FIG. 1, a power semiconductor module 100 comprises a power electronics carrier 102. The power electronics carrier 102 is an electronics carrier that is configured to accommodate the mounting of power devices thereon and to efficiently extract heat away from these devices. According to an embodiment, the power electronics carrier 102 is any one of: a DCB (direct copper bonded) substrate, an AMS substrate (anodized metal substrate), an AMB substrate (active metal brazed), or an IMS (insulated metal substrate) substrate. The power electronics carrier 102 comprises a structured metallization layer 104 disposed an upper side of an electrically insulating substrate 106 and a second metallization layer 108 disposed on a rear side of the electrically insulating substrate 106. The structured metallization layer 104 comprises a plurality of pads that are electrically isolated from one another and configured to accommodate the mounting of semiconductor dies and/or provide electrical interconnect. The structured metallization layer 104 and the second metallization layer 108 may comprise or be plated with any or more of Cu, Ni, Ag, Au, Pd, Pt, NiV, NiP, NiNiP, NiP/Pd, Ni/Au, NiP/Pd/Au, or NiP/Pd/AuAg. The electrically insulating substrate 106 may comprise a ceramic material. For claim, the electrically insulating substrate 106 can be a thin ceramic layer that is formed from or comprises any one or more of the following materials: aluminum oxide; aluminum nitride; zirconium oxide; silicon nitride; boron nitride; silicon carbide, beryllium oxide, or any other dielectric ceramic.

The power semiconductor module 100 comprises a semiconductor die 110 mounted on the power electronics carrier 102. The semiconductor die 110 may be mounted and (optionally) electrically connected to the structured pads of the structured metallization layer 104 by a conductive adhesive, e.g., solder, sinter, conductive glue, etc. According to an embodiment, the semiconductor die 110 is configured as a power semiconductor die. A power semiconductor die refers to a single device that is rated to accommodate voltages of at least 100V (volts), and more typically voltages of 600V, 1200V or more and/or is rated to accommodate currents of at least 1 A (amperes), and more typically currents of 10 A, 50 A, 100 A or more. Claims of power semiconductor dies include discrete power diodes and discrete power transistor dies, e.g., MOSFETs (Metal Oxide Semiconductor Field Effect Transistors), IGBTs (Insulated Gate Bipolar Transistors), and HEMTs (High Electron Mobility Transistors), etc. Separately or in combination, the power semiconductor module 100 may comprise other types of devices, e.g., logic devices, custom circuits, controllers, sensing devices, passive elements, etc. While only one semiconductor die 110 is shown in the figure, the power semiconductor module 100 may comprise multiple semiconductor devices mounted on the power electronics carrier 102 along with additional elements such as passive elements. For claim, the power semiconductor module 100 may be configured as a power converter or power inverter comprising power transistors that form the high-side switch and low-side switch of a half-bridge circuit.

The power semiconductor module 100 comprises a housing that surrounds an interior volume over the power electronics carrier 102. The interior volume refers to a three-dimensional space that the power electronics carrier 102 and elements mounted thereon are disposed within. The housing comprises a baseplate 112 and a cover 114 that is affixed to the baseplate 112. The baseplate 112 may be formed from a thermally conductive material, such as a metal, e.g., copper, aluminum, alloys thereof, etc. The cover 114 may formed from a plastic material, for claim. The cover 114 may be securely affixed to the baseplate 112 by an adhesive material, such as a polymer-based electronics glue, thereby forming a complete seal around the interior volume. In another embodiment, the baseplate 112 may be omitted from the power semiconductor module 100. In that case, the housing sidewalls may be affixed directly to the power electronics carrier 102 such that the power electronics carrier 102 forms the floor section of the power semiconductor module 100. A potting compound 116 may be provided within the interior volume to encapsulate the semiconductor die 110 and electrical connections. The potting compound 116 may a rigid molding compound, polymer matrix of a thermosetting plastic or thermoplastic, a curable dielectric gel, such as a silicone-based dielectric gel.

The power semiconductor module 100 comprises a metal pin 118 that is attached to the structured metallization layer 104 and protrudes outs of the housing. The metal pin 118 may form a terminal of the power semiconductor module 100. To this end, power semiconductor module 100 may comprise interconnect element that forms an electrical connection between the semiconductor die 110 and the pad to which the metal pin 118 connects with. The interconnect element may be a bond wire (as shown) or other type of interconnect element such as a metal clip or ribbon. The metal pin 118 may be directly attached to the structured metallization layer 104, e.g., by soldering or welding. In another embodiment (not shown), the metal pin 118 may be provided within sidewalls of the housing. The metal pin 118 may have a wide variety of geometric configurations. For claim, the metal pin 118 may be configured as a press-fit connector that is designed to be mated with an external socket and form an electrical connection thereto.

FIG. 1 illustrates exemplary cracks 120 that arise in the electrically insulating substrate 106 of the power electronics carrier 102. These cracks 120 are fault lines that interrupt the continuity of the electrically insulating substrate 106. Stated another way, the cracks 120 are points of mechanical failure in the material of the electrically insulating substrate 106. The cracks 120 can arise from a variety of different sources. For claim, events that apply significant amounts of heat to the power electronics carrier 102 may create stress in the electrically insulating substrate 106 due to mismatches in CTE (coefficient of thermal expansion). More particularly, a difference in CTE as between the metal material of the metallization layers and the insulating material of the electrically insulating substrate 106 (e.g., ceramic) may cause cracks 120 arising from tensile stress. Separately or in combination, the cracks 120 may arise from mechanical forces being applied to the electrically insulating substrate 106. The cracks 120 can be present at any different point throughout the assembly of the power semiconductor module 100. For claim, the cracks 120 may be initially present in the power electronics carrier 102 before any assembly steps are taken, e.g., through manufacturing defects and/or damage from transit. Separately or in combination, the cracks 120 may arise during the assembly of the power semiconductor module 100, e.g., through assembly steps that apply heat and/or mechanical pressure to the power electronics carrier 102. Separately or in combination, the cracks 120 may arise after completion of the fabrication of the power semiconductor module 100, e.g., through mechanical damage from transit, assembly, or operation of the power semiconductor module 100 and/or through exposure of the power semiconductor module 100 to excessive amounts of heat.

If the cracks 120 in the electrically insulating substrate 106 are severe enough, they can cause complete device failure, e.g., by complete dielectric breakdown of the electrically insulating substrate 106. If the cracks 120 in the electrically insulating substrate 106 are less severe but still significant, they can degrade performance of the power semiconductor module 100 and/or shorten the useful life of the power semiconductor module 100 by worsening over time. Still other cracks 120 may be small enough or dispersed enough to be completely benign.

Figure 2:
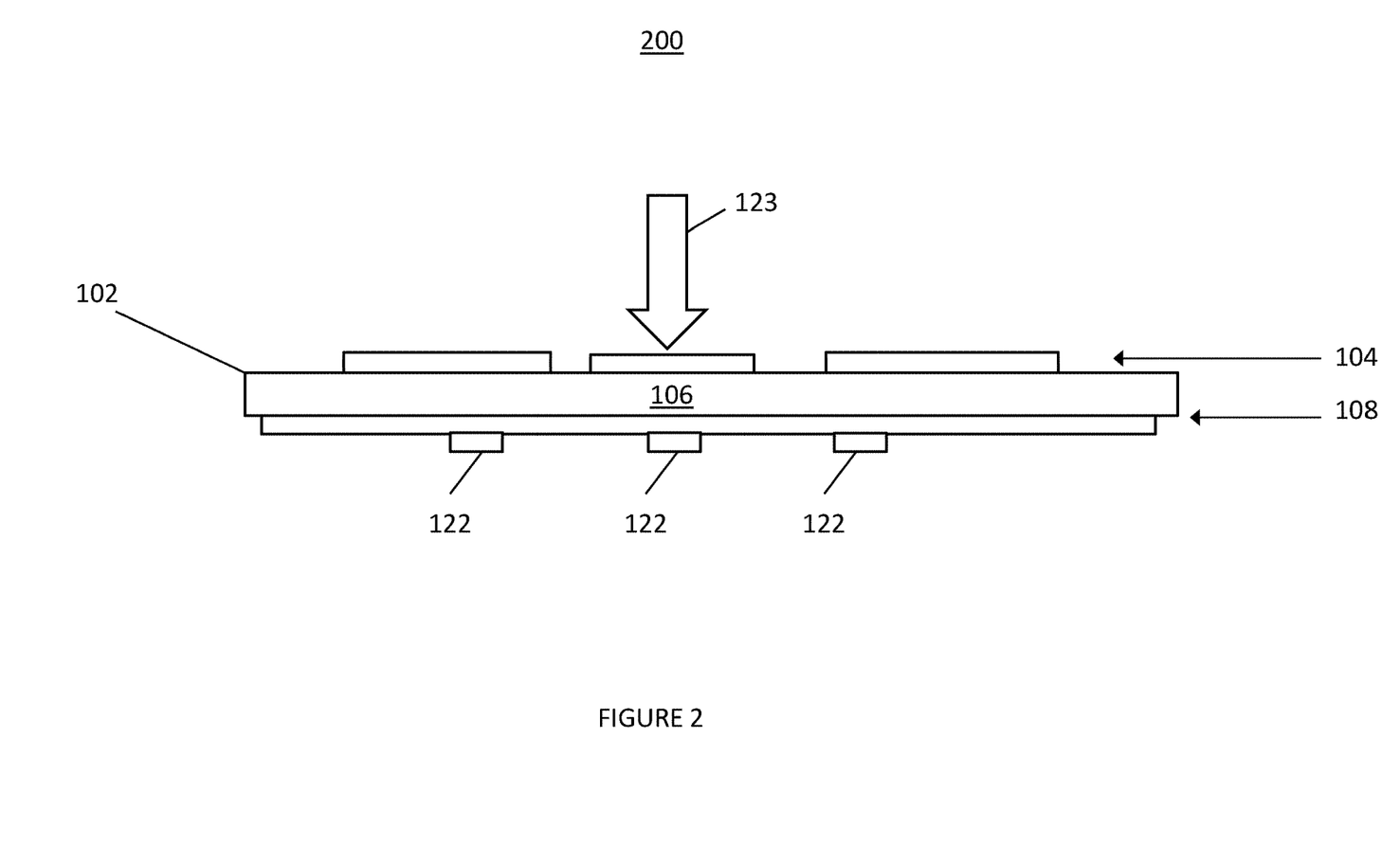
FIG. 2 illustrates an arrangement for testing a power electronics carrier during assembly of a power semiconductor module, according to an embodiment.

Referring to FIG. 2, a testing arrangement 200 that may be used during the production of the power semiconductor module 100 is shown. In this example, sensors 122 are brought into contact with the second metallization layer 108 at different locations. The sensors 122 can be any type of device that can detect the presence of cracks 120 in the electrically insulating substrate 106. According to an embodiment, the sensors 122 are configured as acoustic emission sensors. The testing arrangement 200 additionally comprises a heater that is used to apply heat 123 to the structured metallization layer 104. The heater may comprise a metal probe that contacts the structured metallization layer 104 and applies the heat 123. The power electronics carrier 102 may be tested by applying the heat 123 to the power electronics carrier 102, and using the sensor to detect whether any cracks 120 arise in the electrically insulating substrate 106 and/or whether any existing cracks 120 worsen. More generally, a variety of different testing arrangements and techniques may be used during the production. These testing arrangements may bring the sensors 122 in contact with the metallization layers of the power electronics carrier 102 or alternatively may arrange the sensors 122 at a sufficient distance such that sensing is possible, e.g., in the case of non-contact sensor devices. These testing arrangements may provide an independent heat source or alternatively may involve testing the power semiconductor module 100 during processing steps that require the application of heat.

Figure 3:
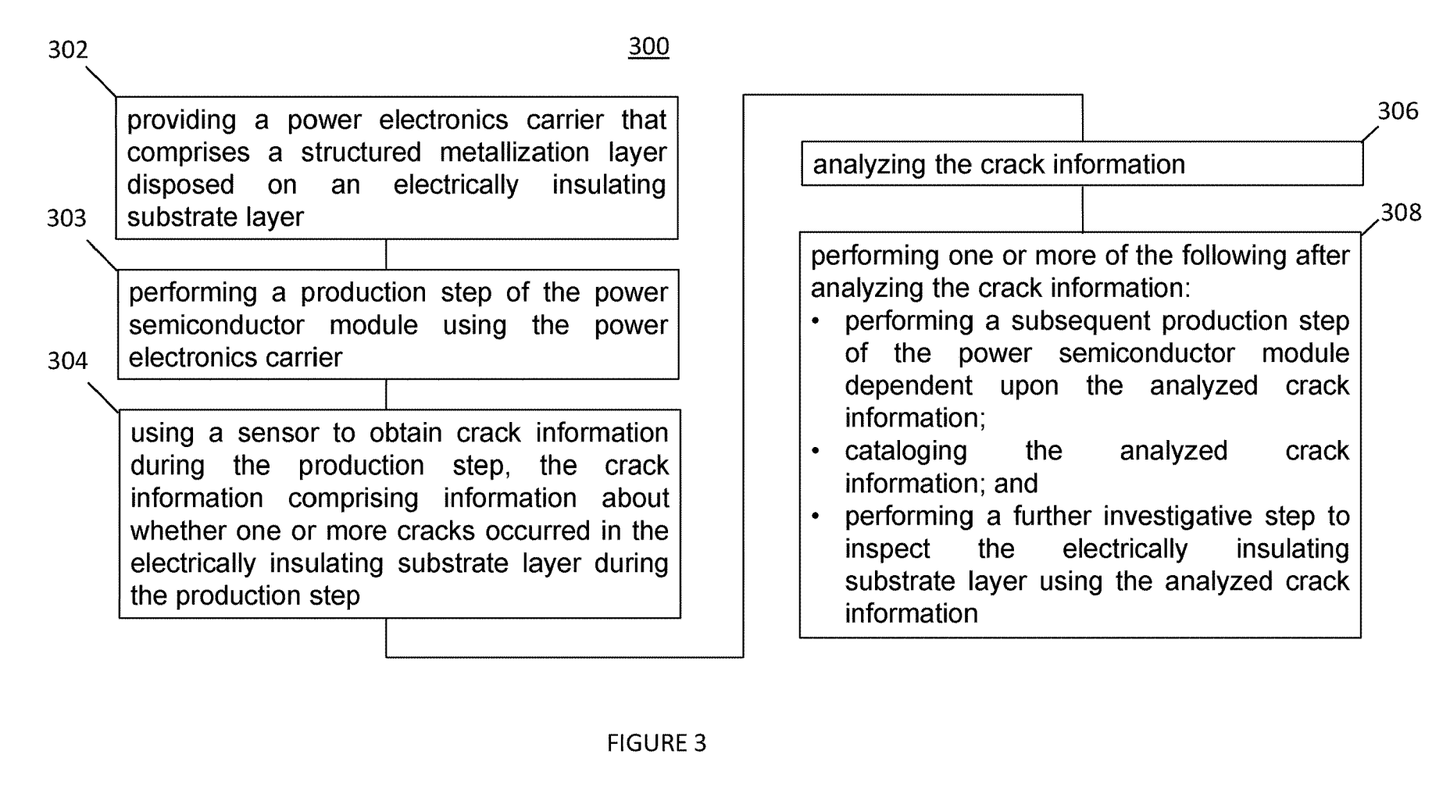
FIG. 3 illustrates a method of producing a power semiconductor module, according to an embodiment.

Referring to FIG. 3, method 300 for producing a power semiconductor module 100 is schematically illustrated. The method 300 may be used to produce multiple power semiconductor modules 100 in succession or in parallel.

A first method step 302 comprises providing a power electronics carrier 102 that comprises a structured metallization layer 104 disposed on an electrically insulating substrate 106. The power electronics carrier 102 can be provided by a separate manufacturer as the entity performing the method 300.

A second method step 303 comprises performing a production step of the power semiconductor module using the power electronics carrier 102. These production steps include assembly steps that incorporate components into the power semiconductor module 100 and form connections between these elements. Examples of these assembly steps include die attach, interconnect formation, dispensation of the potting compound 116, attachment of the housing 114, etc. These production steps can also include testing steps that verify a function or performance of the components of the power semiconductor module 100 or the power semiconductor module 100 itself.

A third method step 304 comprises using a sensor 122 to obtain crack information during the production step. The sensor 122 can be any type of device that produces an output signal in response to the presence of a crack 120 within the electrically insulating substrate 106. Embodiments of the sensor 122 include acoustic emission sensors, laser doppler vibrometers, acceleration sensors, and force sensors. The sensor 122 can use a variety of different techniques to inspect the electrically insulating substrate 106 and obtain the crack information. These techniques may utilize acoustic wave propagation, electromagnetic wave propagation, mechanical vibration, and so forth.

The crack information comprises information about whether one of more cracks 122 have occurred in the electrically insulating substrate 106 layer during the production step. That is, the crack information indicates whether the sensor 122 has sensed one of the cracks 122 arising in the electrically insulating substrate 106 during the production step. According to an embodiment, the crack information additionally comprises information about the nature of cracks 120 in the electrically insulating substrate 106 if present. The information about the nature of cracks 120 may comprise any information that characterizes the cracks 120. According to an embodiment, the information about the nature of cracks 120 comprises any one or combination of: a total number of cracks 120 throughout the electrically insulating substrate 106, a location of each crack 120 throughout the electrically insulating substrate 106, a size of each crack 120 throughout the electrically insulating substrate 106; and a time at which each crack 120 occurs. Different sensor arrangements including multi-sensor arrangements may be used to provide the information about the nature of cracks 120. For example, according to an embodiment, the method comprises providing a plurality of sensors 122 and arranging these sensors 122 at different measurement locations, e.g., as in the testing arrangement 200 described with reference to FIG. 2. Information about the nature of cracks 120 can be provided by operating the sensors 122 together in unison. In one example, the plurality of the sensors 122 are acoustic wave sensors 122 that determine the location of each crack 120 by triangulation.

A fourth method step 306 comprises analyzing the crack information. The analysis of the crack information can be performed by a processing device such as a special-purpose or general-purpose computer that receives the output of the sensor 122, e.g., from a wireless or wired connection. Analyzing the crack information may comprise any one or more of: comparison, quantification, interpretation, for example. For example, analyzing the information may comprise comparing the output of the sensor 122 with a waveform or other type of signal transmission that is known to be indicative of a crack. Separately or in combination, analyzing the information may comprise counting the number of times the output of the sensor 122 provides a signal that represents the occurrence of a crack 120. Separately or in combination, analyzing the information may comprise interpreting the output of the sensor 122 to determine whether the output is consistent with a detected crack 120 and, if so, how large the detected crack 120 is.

According to an embodiment, analyzing the crack information comprises assigning a passing status or a failing status to the power electronics carrier 102. The passing status may be assigned if no cracks 120 exist, meaning that after a complete inspection no signal generated by the sensor 122 was determined to be consistent with a crack 120. The passing status may also be assigned if the nature of cracks 120 in the electrically insulating substrate 106 satisfies predefined passing criteria. The predefined passing criteria can be satisfied if the number, size, volume or any combination thereof of the cracks 120 are not likely to cause failure throughout the life of the power semiconductor module 100, for example. The failing status may be assigned if one or more cracks 120 exist and the nature of the one or more cracks 120 in the electrically insulating substrate 106 satisfies predefined failing criteria. The predefined failing criteria can be satisfied if the number, size, volume or any combination thereof of the cracks 120 are likely to cause failure throughout the life of the power semiconductor module 100, for example. Optionally, analyzing the crack information may additionally comprise assigning a warning status if one or more cracks 120 exist and the nature of the one or more cracks 120 satisfies predefined warning criteria.

The warning criteria can represent an intermediate status between passing and failing wherein the number, size, volume or any combination thereof of the cracks 120 are not likely to cause failure throughout the life of the power semiconductor module 100 but warrant further evaluation at some point during manufacture or usage.

A fifth method step 308 comprises performing one or more of the following after analyzing the crack information: performing a subsequent production step of the power semiconductor module dependent upon the analyzed crack information, cataloging the analyzed crack information, and performing a further investigative step to inspect the electrically insulating substrate layer using the analyzed crack information. These steps may be performed immediately after analyzing the crack information and/or before performing the next production step for forming the power semiconductor module 100.

Performing the subsequent production step of the power semiconductor module 100 dependent upon the analyzed crack information may comprise performing the production step contingent upon the analysis of the crack information. For example, a particular production step may be performed only if the analysis of the crack information assigns a certain status. Performing the production step of the power semiconductor module 100 dependent upon the analyzed crack information may also comprise using the analyzed crack information to instruct or guide the subsequent production step. For example, a particular production step may use information about the number, location, severity of the cracks 120 to perform a repair.

The production step that is performed dependent upon the analysis of the information can be any step between the provision of the power electronics carrier 102 and completion or qualification of the power semiconductor module 100. These production steps include assembly steps that incorporate components into the power semiconductor module 100 and form connections between these elements. Examples of these assembly steps include die attach, interconnect formation, dispensation of the potting compound 116, attachment of the housing, etc. The production step that is performed dependent upon the analysis of the information can also include testing steps that verify a function or performance of the components of the power semiconductor module 100 or the power semiconductor module 100 itself.

According to an embodiment, the method 300 comprises using a sensor to obtain crack information during the first production step that is performed. More particularly, immediately after the power electronics carrier 102 is provided, a production step is performed and one or more sensors 122 are used to obtain crack information, the crack information is analyzed, and the passing and failing status are assigned in the above-described manner. If a passing status is assigned, the subsequent processing step is performed. If a failing status is assigned, the power electronics carrier 102 is replaced with another power electronics carrier 102 and the inspection process is repeated. This reduces the possibility of costly and time-consuming steps being unnecessarily performed by filtering out defective power electronics carriers 102.

According to an embodiment, the method 300 comprises performing a plurality of the production steps, using the sensor 122 to the obtain the crack information and analyzing the crack information after performing one of the production steps, and performing a subsequent one of the production steps from the plurality dependent upon the analyzed crack information that was most recently obtained. In this case, the sensor 122 can be used to inspect the power electronics carrier 102 on an ongoing basis to ensure that cracks 120 of sufficient severity do not arise during manufacture. More particularly, during each one of the production steps, one or more sensors 122 are used to obtain crack information, the crack information is analyzed and the passing and failing status are determined in the above-described manner. In an embodiment, this is done during production steps that may induce cracks 120 in the electrically insulating substrate 106. Production steps that may induce cracks 120 in the electrically insulating substrate 106 include steps that thermally cycle the power electronics carrier 102 and thus create mechanical stress in the electrically insulating substrate 106 due to CTE mismatch of the materials. One example of a step that thermally cycles the power electronics carrier 102 is an assembly step whereby elements of the power semiconductor module 100 are affixed to one another by application of heat. Examples of these assembly steps comprise soldering or sintering steps, wire bonding steps, welding, or attachment of the housing. Another example of a step that thermally cycles the power electronics carrier 102 is a testing step whereby the power electronics carrier 102 is heated as part of a functional test of the devices or connections mounted on the power electronics carrier 102. The test may involve a direct test of whether the devices or connections can withstand heat or a test wherein the power electronics substrate is heated indirectly. Examples of these testing steps includes thermal shock test (TST) whereby the power electronics carrier 102 is subjected to rapid temperature changes to test for CTE mismatch between the structured metallization and the electrically insulating layer, power cycling tests whereby the semiconductor devices are cycled through different operational states with maximum heat generation, isocrack tests whereby the power electronics carrier 102 is slowly heated to test for localized cracks 120, and final tests whereby the completed power semiconductor module 100 is thermally cycled to test for reliability of the assembly.

The method 300 may comprise cataloging the crack information. Cataloging the crack information refers to a step whereby the information is stored in a manner that it can later be referred to. The information can be associated with, i.e., cross-referenced to, identifying information, such as identifying information about the power semiconductor module 100 itself or information that identifies the methods, machines or components used to produce the power semiconductor module 100.

According to an embodiment, cataloging the analyzed crack information comprises storing the crack information in a database and associating it with a unique identifier of the power semiconductor module 100. The unique identifier may be a part number or serial number of the power semiconductor module 100, for example. The database may be referenced each time the power electronics carrier 102 is inspected in the future, whether it be in further processing steps or after production is complete and the power semiconductor module 100 is operational, such that a determination can be made as to whether any differences exist, e.g., in the number, size and location of the cracks 120.

According to an embodiment, cataloging the analyzed crack information comprises storing the crack information in a database and associating it with a processing tool used to perform the processing step in which the sensor 122 was used to obtain the crack information The processing tool can be any tool that is used to manufacture the power semiconductor module 100. In particular, the processing tool can be a processing tool that applies heat and or/mechanical pressure to the power electronics carrier 102. Examples of these processing tools include wire bonding machines, solder ovens, testing apparatuses, etc. The database may be used to determine whether certain processing tools are associated with the formation of cracks 120 and hence need to be replaced, repaired or adjusted.

According to an embodiment, cataloging the analyzed crack information comprises storing the crack information in a database and associating it with a supplier that provides the power electronics carrier 102. The database may be used to compare the quality from various suppliers.

The method 300 may comprise performing a further investigative step to inspect the electrically insulating substrate 106 using the analyzed crack information. The further investigative steps may ascertain information beyond the capabilities of the sensor 122. For example, the further investigative step may comprise using a microscope, such as a scanning electron microscope to obtain detailed information about the size and shape of the cracks 120. The information derived from the further investigative step may be used instead of or in combination with the analyzed crack information to perform a further production step of the power semiconductor module 100 and/or catalogue the analyzed crack information in the above-described manner. For example, the information derived from the further investigative step may be used to assign the passing or failing status and continue production based on this assignment. Separately or in combination, the information derived from the further investigative step may be stored in a database and later referred to.

Figure 4:
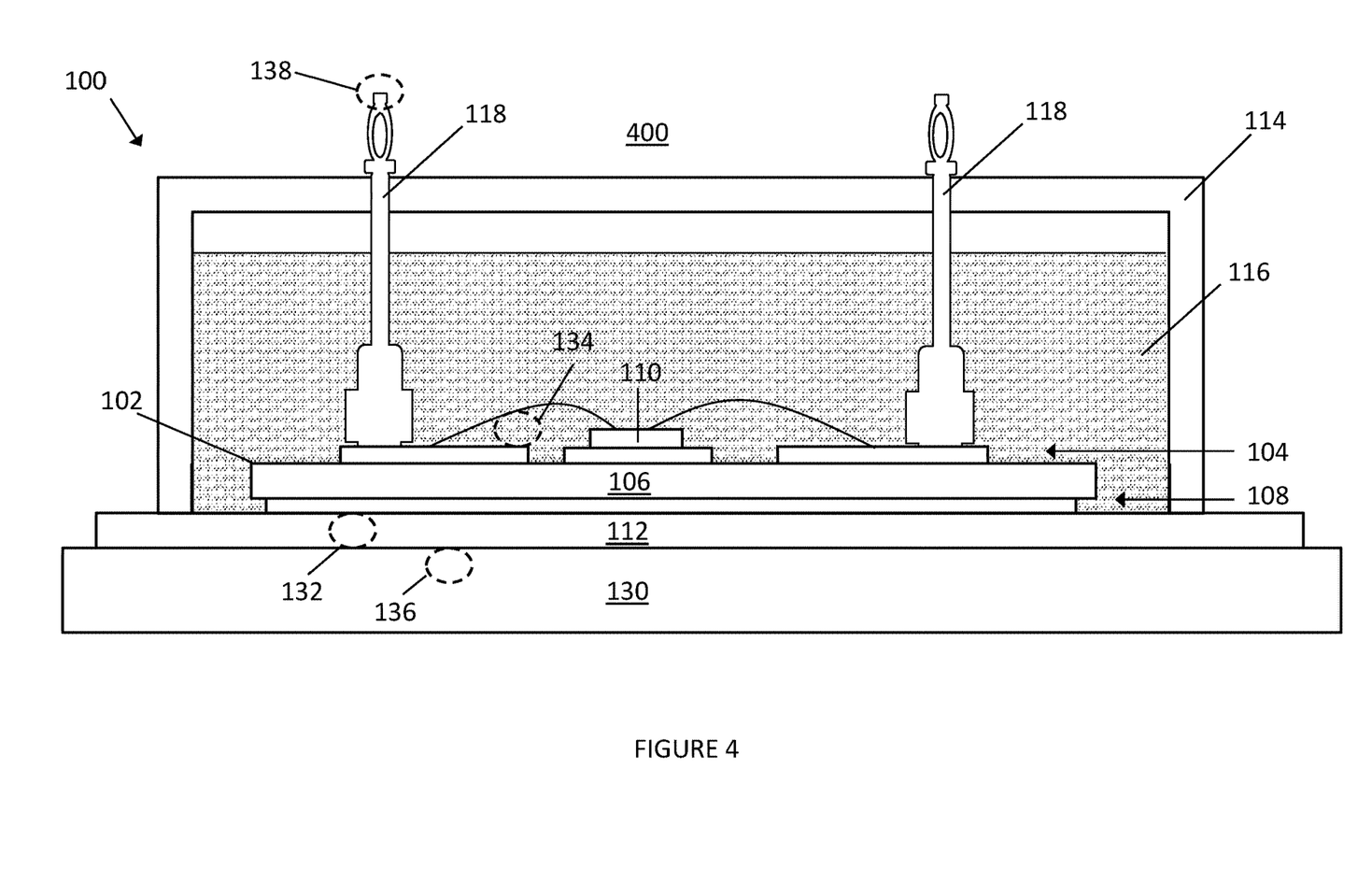
FIG. 4 illustrates an arrangement for testing a power semiconductor module during operation of the module, according to an embodiment.

Referring to FIG. 4, an assembly 400 comprising the power semiconductor module 100 is shown, according to an embodiment. The assembly 400 may correspond to an installed power semiconductor module 100 that is in use. In addition to the power semiconductor module 100, the assembly 400 comprises a carrier 130 that the power semiconductor module 100 is mounted on. The carrier 130 may be a circuit carrier 130 such as a PCB (printed circuit board) that accommodates the mounting of multiple electronics devices thereon. The assembly 400 may thus comprise additional electronics devices mounted on the carrier 130 that are not shown in the figure, e.g., additional power semiconductor modules 100, passive components, etc.

The assembly 400 comprises at least one sensor 122 that is configured to obtain information about the existence of cracks 120 in the electrically insulating substrate 106. According to an embodiment, the sensor 122 is incorporated into the assembly 400 as a permanent fixture. FIG. 4 illustrates four such locations for the arrangement of one or more sensors 122 within the assembly 400. A first location 132 for the placement of one or more sensors 122 is within the baseplate 112 in close proximity to the second metallization layer 108. A second location 134 for the placement of the sensors 122 is on top of the power electronics carrier 102 in close proximity to the electrically insulating substrate 106, e.g., disposed on the structured metallization layer 104. A third location 136 for the placement of the sensors 122 is on the carrier 130 in close proximity to the interface with the metal baseplate 112. In the above descriptions, the term "close proximity" means that the sensor 122 is sufficiently close to obtain a reading of the electrically insulating substrate 106. According to another embodiment, the sensor 122 can temporarily contact the power semiconductor module 100 for testing and removed thereafter, if desired. FIG. 4 illustrates a fourth location 138 at an outer end of the metal pin 118 in which this temporary contact can take place. In this case, the sensor 122 can transmit and receive a signal, such as an acoustic or electromagnetic signal, to the electrically insulating substrate 106 via the metal pin 118.

Figure 5:
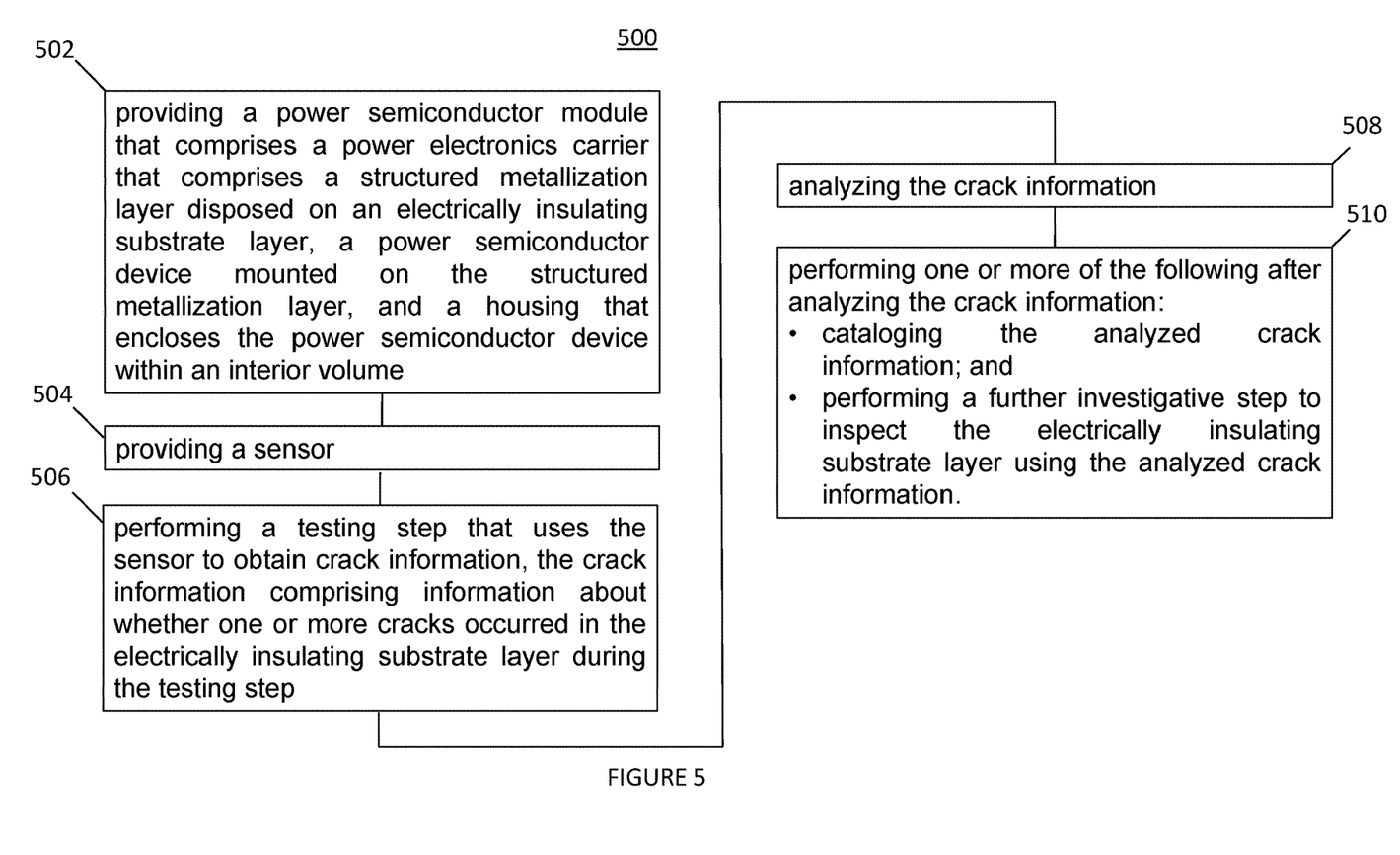
FIG. 5 illustrates a method of producing a power semiconductor module, according to an embodiment.

Referring to FIG. 5, method 500 for testing a power semiconductor module 100 is schematically illustrated. The method 500 may be used to test a power semiconductor module 100 during production or the power semiconductor module 100 or during operation of the power semiconductor module 100.

A first method step 502 comprises providing a power semiconductor module 100 that comprises power electronics carrier 102 that comprises a structured metallization layer 104 disposed on an electrically insulating substrate 106, a power semiconductor device mounted on the structured metallization layer 104, and a housing that encloses the power semiconductor device within an interior volume.

A second method step 504 comprises providing a sensor 122. The sensor 122 may be provided at any of the first, second, third and fourth locations 132, 134, 136 and 138 described with reference to FIG. 4, for example.

A third method step 506 comprises performing a testing step that uses the sensor 122 to obtain crack information, the crack information comprising information about whether one or more cracks occurred in the electrically insulating substrate layer during the testing step. This may be done in accordance with any of the embodiments of the third method step 304 of the method 300 described with reference to FIG. 3.

A fourth method step 508 comprises analyzing the crack information. This may be done in accordance with any of the embodiments of the fourth method step 306 of the method 300 described with reference to FIG. 3. In addition, analyzing the crack information may comprise comparing the crack information to a previously stored version of the crack information that is associated with the power semiconductor module 100. That is, the crack information that is obtained by the instant testing process is compared with crack information obtained at a previous time, whether it be from a previous test of the power semiconductor module 100 after production is complete or from a test of the power semiconductor module 100 during production. For example, the previously stored version of the crack information can be information stored in a database, e.g., according to the fifth method step 308 described with reference to FIG. 3. The analysis can be used to asses any changes in the severity of the cracks 120, e.g., changes in the size, number and location of the cracks 120. This comparison can be factored into the status assigned to the power semiconductor module 100 by the instant analysis. For example, according to an embodiment, any one or more of the predefined passing criteria, the predefined failing criteria, and the predefined warning criteria can incorporate the comparison of the crack information to a previously stored version of the crack information as described above. In this way, a power semiconductor module 100 can be flagged as warning if the comparison shows that the severity of the cracks 120 has worsened over time.

The analysis of the crack information can be used to take further action with respect to the power semiconductor module 100. For example, if a failing status is assigned, the power semiconductor module 100 can be repaired or replaced by a technician. If a warning status is assigned, the power semiconductor module 100 can be tested more frequently or scheduled for replacement sooner than it otherwise would have. In this way, the method 500 allows for real time monitoring of the power semiconductor module 100 and corrective action.

A fifth method step 510 comprises performing one or more of the following after analyzing the crack information: cataloging the analyzed crack information, and performing a further investigative step to inspect the electrically insulating substrate layer 106 using the analyzed crack information.

According to an embodiment, the method 500 comprises cataloging the analyzed crack information. This may be done in accordance with any of the embodiments of the fifth method step 308 of the method 300 described with reference to FIG. 3, except that instead of cross-referencing the crack information to the processing tools used in the manufacture, the analyzed crack information may be cross-referenced to other unique information about the assembly 400 and/or application that utilizes the power semiconductor module 100. For instance, the analyzed crack information may be cross-referenced to the circuit carrier 130 that the power semiconductor module 100 is mounted on, or more generally, the application that the assembly 400 is used in. In another embodiment, the analyzed crack information may be cross-referenced to the operational parameters of the power semiconductor module 100. This process can be carried out across a variety of different power semiconductor modules 100 and the stored information can be analyzed to recognize correlations between particular assembly conditions or applications and the propensity for cracking in of the electrically insulating substrate 106.

According to an embodiment, the method 500 comprises performing a further investigative step to inspect the electrically insulating substrate 106 using the analyzed crack information. The further investigative steps may ascertain information beyond the capabilities of the sensor 122. For example, the further investigative step may comprise using a microscope, such as a scanning electron microscope to obtain detailed information about the size and shape of the cracks 120. The information derived from the further investigative step may be used instead of or in combination with the analyzed crack information to assign a status to the power semiconductor module 100.

Although the present disclosure is not so limited, the following numbered examples demonstrate one or more aspects of the disclosure.

Example 1. A method of producing a power semiconductor module, the method comprising: providing a power electronics carrier that comprises a structured metallization layer disposed on an electrically insulating substrate layer; performing a production step of the power semiconductor module using the power electronics carrier; using a sensor to obtain crack information during the production step, the crack information comprising information about whether one or more cracks occurred in the electrically insulating substrate layer during the production step; analyzing the crack information; and performing one or more of the following after analyzing the crack information: performing a subsequent production step of the power semiconductor module dependent upon the analyzed crack information; cataloging the analyzed crack information; and performing a further investigative step to inspect the electrically insulating substrate layer using the analyzed crack information.

Example 2. The method of example 1, wherein the crack information further comprises information about the nature of cracks in the electrically insulating substrate layer if present, and wherein the information about the nature of cracks comprises a total number of cracks throughout the electrically insulating substrate layer.

Example 3. The method of example 2, wherein the information about the nature of cracks further comprises one or both of: a location of each crack throughout the electrically insulating substrate layer; a size of each crack throughout the electrically insulating substrate; a time at which each crack occurred.

Example 4. The method of example 2, wherein the method comprises performing the subsequent production step of the power semiconductor module dependent upon the analyzed crack information.

Example 5. The method of example 4, wherein analyzing the crack information comprises: assigning a passing status if no cracks occurred or the nature of cracks in the electrically insulating substrate layer satisfies predefined passing criteria; and assigning a failing status if one or more cracks occurred and the nature of the one or more cracks in the electrically insulating substrate layer satisfies predefined failing criteria, and wherein the subsequent production step is performed if the passing status is assigned and discarding the power electronics carrier if the failing status is assigned.

Example 6. The method of example 4, wherein the production step of the power semiconductor module is an assembly step whereby elements of the power semiconductor module are affixed to one another by application of heat.

Example 7. The method of example 4, wherein the production step of the power semiconductor module is a testing step whereby the power electronics carrier is heated as part of a functional test of the devices or connections mounted on the power electronics carrier.

Example 8. The method of example 2, wherein the method comprises cataloging the analyzed crack information.

Example 9. The method of example 8, wherein cataloging the analyzed crack information comprises storing the crack information in a database and associating it with a unique identifier of the power semiconductor module.

Example 10. The method of example 8, wherein cataloging the analyzed crack information comprises storing the crack information in a database and associating it with a processing tool used to perform a production step that was performed immediately before the sensor was used to obtain the crack information.

Example 11. The method of example 2, wherein the method comprises performing the further investigative step to inspect the electrically insulating substrate layer using the analyzed crack information.

Example 12. The method of example 1, wherein the power electronics carrier is any one of: a DCB substrate, an AMS substrate, an AMB substrate, or an IMS substrate.

Example 13. A method of testing a power semiconductor module, the method comprising: providing a power semiconductor module that comprises a power electronics carrier that comprises a structured metallization layer disposed on an electrically insulating substrate layer, a power semiconductor die mounted on the structured metallization layer, a housing that encloses the power semiconductor device within an interior volume; providing a sensor; performing a testing step that uses the sensor to obtain crack information, the crack information comprising information about whether one or more cracks occurred in the electrically insulating substrate layer during the testing step; analyzing the crack information; and performing one or more of the following after analyzing the crack information: cataloging the analyzed crack information; and performing a further investigative step to inspect the electrically insulating substrate layer using the analyzed crack information.

Example 14. The method of example 13, wherein the crack information further comprises information about the nature of cracks in the electrically insulating substrate layer if present, and wherein the information about the nature of cracks comprises any one or more of: a total number of cracks throughout the electrically insulating substrate layer; a location of each crack throughout the electrically insulating substrate layer; a size of each crack throughout the electrically insulating substrate; a time at which each crack occurred.

Example 15. The method of example 14, wherein the method comprises providing a plurality of the sensors on or within the power semiconductor module, wherein the testing step uses each of the sensors in the plurality to obtain the crack information, and wherein the information about the nature of cracks in the electrically insulating substrate layer comprises the location of each crack throughout the electrically insulating substrate layer.

Example 16. The method of example 14, wherein analyzing the crack information comprises assigning a status to the power semiconductor module, and wherein assigning the status comprises: assigning a passing status if no cracks exist or the nature of cracks in the electrically insulating substrate layer satisfies predefined passing criteria; assigning a failing status if one or more cracks exist and the nature of the one or more cracks satisfies predefined failing criteria; and assigning a warning status if one or more cracks exist and the nature of the one or more cracks satisfies predefined warning criteria.

Example 17. The method of example 13, wherein analyzing the crack information comprises comparing the crack information to a previously stored version of the crack information that is associated with the power semiconductor module.

Example 18. The method of example 13, wherein the power semiconductor module comprises a metal pin that is attached to the structured metallization layer and protrudes outs of the housing, and wherein performing the testing step comprises arranging the sensor in contact with an outer end of the metal pin.

Example 19. The method of example 13, wherein the sensor is provided to be within the power semiconductor module.

Example 20. The method of example 13, further comprising mounting the power semiconductor module on a circuit board, wherein the sensor is provided to be within the circuit board.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of producing a power semiconductor module, the method comprising:
    providing a power electronics carrier that comprises a structured metallization layer disposed on an electrically insulating substrate layer;
    performing a production step of the power semiconductor module using the power electronics carrier;
    using a sensor to obtain crack information during the production step, the crack information comprising information about whether one or more cracks occurred in the electrically insulating substrate layer during the production step;
    analyzing the crack information; and
    performing one or more of the following after analyzing the crack information:
        performing a subsequent production step of the power semiconductor module dependent upon the analyzed crack information;
        cataloging the analyzed crack information; and
        performing a further investigative step to inspect the electrically insulating substrate layer using the analyzed crack information.

2. The method of claim 1, wherein the crack information further comprises information about the nature of cracks in the electrically insulating substrate layer if present, and wherein the information about the nature of cracks comprises a total number of cracks throughout the electrically insulating substrate layer.

3. The method of claim 2, wherein the information about the nature of cracks further comprises any one of:
    a location of each crack throughout the electrically insulating substrate layer; and
    a size of each crack throughout the electrically insulating substrate;
    a time at which each crack occurred.

4. The method of claim 2, wherein the method comprises performing the subsequent production step of the power semiconductor module dependent upon the analyzed crack information.

5. The method of claim 4, wherein analyzing the crack information comprises:
    assigning a passing status if no cracks occurred or the nature of cracks in the electrically insulating substrate layer satisfies predefined passing criteria; and
    assigning a failing status if one or more cracks occurred and the nature of the one or more cracks in the electrically insulating substrate layer satisfies predefined failing criteria, and
    wherein the subsequent production step is performed if the passing status is assigned and discarding the power electronics carrier if the failing status is assigned.

6. The method of claim 4, wherein the production step of the power semiconductor module is an assembly step whereby elements of the power semiconductor module are affixed to one another by application of heat.

7. The method of claim 4, wherein the production step of the power semiconductor module is a testing step whereby the power electronics carrier is heated as part of a functional test of the devices or connections mounted on the power electronics carrier.

8. The method of claim 2, wherein the method comprises cataloging the analyzed crack information.

9. The method of claim 8, wherein cataloging the analyzed crack information comprises storing the crack information in a database and associating it with a unique identifier of the power semiconductor module.

10. The method of claim 8, wherein cataloging the analyzed crack information comprises storing the crack information in a database and associating it with a processing tool used to perform a production step that was performed immediately before the sensor was used to obtain the crack information.

11. The method of claim 2, wherein the method comprises performing the further investigative step to inspect the electrically insulating substrate layer using the analyzed crack information.

12. The method of claim 1, wherein the power electronics carrier is any one of: a DCB substrate, an AMS substrate, an AMB substrate, or an IMS substrate.

13. A method of testing a power semiconductor module, the method comprising:
providing a power semiconductor module that comprises a power electronics carrier that comprises a structured metallization layer disposed on an electrically insulating substrate layer, a power semiconductor die mounted on the structured metallization layer, a housing that encloses the power semiconductor device within an interior volume;
providing a sensor;
performing a testing step that uses the sensor to obtain crack information, the crack information comprising information about whether one or more cracks occurred in the electrically insulating substrate layer during the testing step;
analyzing the crack information; and
performing one or more of the following after analyzing the crack information:
cataloging the analyzed crack information; and
performing a further investigative step to inspect the electrically insulating substrate layer using the analyzed crack information.

14. The method of claim 13, wherein the crack information further comprises information about the nature of cracks in the electrically insulating substrate layer if present, and wherein the information about the nature of cracks comprises any one or more of:
a total number of cracks throughout the electrically insulating substrate layer;
a location of each crack throughout the electrically insulating substrate layer;
a size of each crack throughout the electrically insulating substrate; and
a time at which each crack occurred.

15. The method of claim 14, wherein the method comprises providing a plurality of the sensors on or within the power semiconductor module, wherein the testing step uses each of the sensors in the plurality to obtain the crack information, and wherein the information about the nature of cracks in the electrically insulating substrate layer comprises the location of each crack throughout the electrically insulating substrate layer.

16. The method of claim 14, wherein analyzing the crack information comprises assigning a status to the power semiconductor module, and wherein assigning the status comprises:
assigning a passing status if no cracks exist or the nature of cracks in the electrically insulating substrate layer satisfies predefined passing criteria;
assigning a failing status if one or more cracks exist and the nature of the one or more cracks satisfies predefined failing criteria; and
assigning a warning status if one or more cracks exist and the nature of the one or more cracks satisfies predefined warning criteria.

17. The method of claim 13, wherein analyzing the crack information comprises comparing the crack information to a previously stored version of the crack information that is associated with the power semiconductor module.

18. The method of claim 13, wherein the power semiconductor module comprises a metal pin that is attached to the structured metallization layer and protrudes outs of the housing, and wherein performing the testing step comprises arranging the sensor in contact with an outer end of the metal pin.

19. The method of claim 13, wherein the sensor is provided to be within the power semiconductor module.

20. The method of claim 13, further comprising mounting the power semiconductor module on a circuit board, wherein the sensor is provided to be within the circuit board.

* * * * *